United States Patent
Bollesen et al.

(10) Patent No.: US 6,243,264 B1
(45) Date of Patent: Jun. 5, 2001

(54) SRAM HEAT SINK ASSEMBLY AND METHOD OF ASSEMBLING

(75) Inventors: Vernon P. Bollesen, Milpitas; Ron Zhang, Sunnyvale; James A. Jones, Saratoga, all of CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/385,474

(22) Filed: Aug. 30, 1999

(51) Int. Cl.$^7$ ...................................................... H05K 7/20
(52) U.S. Cl. ........................ 361/704; 361/702; 361/719; 174/16.3; 257/718; 257/719; 257/722; 257/727; 165/80.2; 165/80.3
(58) Field of Search ..................................... 361/704, 707, 361/709, 710, 717–721, 722; 165/80.2, 80.3, 185; 174/16.3; 251/706, 707, 712, 713, 726, 727, 718, 719

(56) References Cited

U.S. PATENT DOCUMENTS

| | | | |
|---|---|---|---|
| 4,972,294 | 11/1990 | Moses, Jr. et al. | 361/386 |
| 5,077,638 | 12/1991 | Andersson et al. | 361/388 |
| 5,208,731 | 5/1993 | Blomquist | 361/386 |
| 5,253,702 | 10/1993 | Davidson et al. | 165/80.4 |
| 5,276,585 | 1/1994 | Smithers | 361/704 |
| 5,280,409 * | 1/1994 | Selna et al. | 361/720 |
| 5,282,111 * | 1/1994 | Hopfer | 361/704 |
| 5,307,239 | 4/1994 | McCarty et al. | 361/704 |
| 5,329,426 | 7/1994 | Villani | 361/719 |
| 5,329,993 | 7/1994 | Ettehadieh | 165/104.14 |
| 5,343,362 | 8/1994 | Solberg | 361/710 |
| 5,367,193 | 11/1994 | Malladi | 257/707 |
| 5,373,099 | 12/1994 | Boitard et al. | 174/16.3 |
| 5,423,375 | 6/1995 | Chiou | 165/80.3 |
| 5,570,271 | 10/1996 | Lavochkin | 361/704 |
| 5,586,005 | 12/1996 | Cipolla et al. | 361/719 |
| 5,621,244 | 4/1997 | Lin | 257/713 |
| 5,699,229 | 12/1997 | Brownell | 361/719 |
| 5,730,210 * | 3/1998 | Kou | 165/80.3 |
| 5,748,446 | 5/1998 | Feightner et al. | 361/709 |
| 5,761,041 | 6/1998 | Hassanzadeh et al. | 361/704 |
| 5,847,928 * | 12/1998 | Hinshaw et al. | 361/704 |
| 5,881,800 | 3/1999 | Chung | 165/80.3 |
| 5,883,782 * | 3/1999 | Thurston et al. | 361/704 |
| 5,884,692 | 3/1999 | Lee et al. | 165/80.3 |
| 5,959,350 | 9/1999 | Lee et al. | 257/712 |
| 5,991,151 | 11/1999 | Capriz | 361/704 |
| 6,035,523 * | 3/2000 | McNeil et al. | 29/832 |

* cited by examiner

Primary Examiner—Leo P. Picard
Assistant Examiner—Boris L. Chervinsky
(74) Attorney, Agent, or Firm—Serge J. Hodgson; Gunnison, McKay & Hodgson, L.L.P.

(57) ABSTRACT

A heat sink assembly includes a heat sink, a circuit board and an integrated circuit package. The package is located between the heat sink and the circuit board and attached to a die attach area of the circuit board. A heat sink retainer attached to the heat sink has a base section located adjacent to the circuit board directly opposite the die attach area. The retainer presses the heat sink down uniformly on the package. Further, the downward force applied to the heat sink is countered by an equal upward force applied by the base section of the retainer on the circuit board. Since the base section is located directly opposite the die attach area, the upward force is transferred from the base section directly back to the heat sink without imparting any bending force on the circuit board.

18 Claims, 7 Drawing Sheets

SRAM HEAT SINK ASSEMBLY AND METHOD OF ASSEMBLING

FIELD OF THE INVENTION

The present invention relates generally to the packaging of electronic components in electronic devices. More particularly, the present invention relates to the removable attachment of a heat sink to an integrated circuit package mounted on a circuit board in an electronic device.

BACKGROUND OF THE INVENTION

As the art moves towards smaller higher power integrated circuits such as SRAMS, heat transfer from the integrated circuit package (IC package) becomes increasingly difficult and more important. As used herein, the term "IC package " includes the heat generating integrated circuit as well as the packaging surrounding the integrated circuit.

One conventional technique to remove heat from an IC package is to employ a finned heat sink which is placed in thermal contact with the IC package. In this manner, heat generated by the IC package is conducted to the heat sink and then dissipated to the ambient environment.

Of importance, the heat sink must be reliably attached to the IC package in a manner which does not undesirably stress or damage the IC package or the circuit board to which the IC package is connected. One conventional technique is to employ a thermally conductive adhesive which bonds the heat sink to the IC package. However, thermally conductive adhesives do not adhere well to plastic IC packages resulting in an unacceptably high incidence of bond failure between the plastic IC package and the heat sink. Further, once the heat sink is bonded with the thermally conductive adhesive, it is difficult to remove the heat sink from the IC package without causing damage to the IC package, the heat sink or the circuit board. Yet, it is desirable to have a removable heat sink to readily allow chip repair, rework and/or replacement. Accordingly, it is desirable to avoid the use of thermally conductive adhesives altogether.

One removable heat sink uses clips and/or fasteners to attach the heat sink directly to the IC package. However, when attached in this manner, the heat sink exerts undue force on the IC package which can damage and ultimately destroy the IC package. To avoid this problem, other removable heat sinks are attached directly to the circuit board to which the IC package is connected.

FIG. 1 is a side view of an electronic device 8 which includes a heat sink 10 directly attached by post type fastening members 12A to a circuit board 14 in accordance with the prior art. Located between heat sink 10 and circuit board 14 is an IC package 16 which generates heat during use. IC package 16 is typically electrically connected to circuit board 14 by one or more circuit interconnections, e.g. solder, which are not illustrated in FIG. 1 for purposes of clarity. Fastening members 12A urge heat sink 10 towards circuit board 14 and down onto IC package 16 to make the thermal contact between heat sink 10 and IC package 16.

Although providing the force necessary to make the thermal contact between heat sink 10 and IC package 16, fastening members 12A cause heat sink 10 to press unevenly on IC package 16. In particular, IC package 16 acts as a pivot between heat sink 10 and circuit board 14 so that end 10A of heat sink 10 is urged away from end 14A of circuit board 14 as indicated by arrows 18. This causes the force exerted by heat sink 10 on to IC package 16 to be greater at side 16A of IC package 16 than at side 16B. This uneven force distribution can damage and even crack IC package 16. Further, this uneven force distribution can create a gap between side 16B and heat sink 10 resulting in poor heat transfer between IC package 16 and heat sink 10. Alternatively, or in addition to, this uneven force distribution can cause circuit interconnection failure near side 16B of IC package 16. As those skilled in the art understand, these conditions can ultimately cause failure of device 8.

To avoid these drawbacks, it has become known in the art to attach both sides of heat sink 10 to circuit board 14. As an example, second post type fastening members 12B illustrated in dashed lines in FIG. 1 can be employed. This tends to equalize the force exerted by heat sink 10 on both sides 16A and 16B of IC package 16. However, this also causes the ends 14A, 14B of circuit board 14 to be pulled up by fastening members 12B, 12A, respectively, relative to the die attach region 14C of circuit board 14 to which IC package 16 is attached. This bending force, indicated by arrows 20, causes warpage of circuit board 14 such that circuit board 14 is displaced to a position 22. Over time, this warpage can cause device 8 to fail, e.g. from failure of circuit interconnections between IC package 16 and circuit board 14.

Accordingly, the art needs a heat sink assembly which results in even force application to the IC package and avoids circuit board warpage.

SUMMARY OF THE INVENTION

In accordance with the present invention, a heat sink assembly is presented. The heat sink assembly includes a heat sink, a circuit board and a package comprising an electronic component such as an integrated circuit. The package is located between the heat sink and the circuit board and attached to a die attach area of the circuit board. A heat sink retainer attached to the heat sink has a base section located adjacent to the circuit board directly opposite the die attach area, the base section supporting the circuit board.

Of importance, the retainer presses the heat sink down uniformly on the package. Thus, the heat sink assembly in accordance with the present invention avoids damage caused by the application of uneven force distribution on the package caused by use of conventional heat sink assemblies.

Further, the downward force applied to the heat sink is countered by an equal upward force applied by the base section of the retainer on the circuit board. Since the base section is located directly opposite the die attach area, the upward force is transferred from the base section directly back to the heat sink without imparting any bending force on the circuit board. In this manner, a heat sink assembly in accordance with the present invention avoids circuit board warpage and the ultimate device failure associated with conventional heat sink assemblies.

In one embodiment, a heat sink retainer includes a plurality of fasteners, a base section having a plurality of edges, and a plurality of spring elements, where each spring element of the plurality of spring elements connects a different fastener of the plurality of fasteners to a different edge of the plurality of edges. Each of the spring elements include a riser arm connected to a corresponding one of the fasteners, the fasteners being in the shape of hooks. The heat sink has apertures corresponding to the fasteners, where a diameter of each aperture is less than a distance between each tip of the fasteners and a respective one of the riser arms.

To secure the heat sink, the fasteners are pressed into the apertures in the heat sink. Since the diameter of the apertures is less than the distance between the tips of the fasteners and the respective riser arms, the fasteners are compressed while passing through the apertures. Upon passing through the apertures, the fasteners return to their relaxed state thus attaching the heat sink to the retainer.

To remove the heat sink, the fasteners are compressed towards the respective riser arms. Once compressed, the fasteners easily slip down and through the apertures in the heat sink and the heat sink is removed.

Also in accordance with the present invention, a method of pressing a heat sink into thermal contact with a package including an electronic component is presented. The method includes attaching the package to a die attach area of a substrate such as a circuit board. The heat sink is positioned such that the package is located between the heat sink and the substrate. Fasteners of a retainer are then attached to the heat sink, where the fasteners impart a downward force on the heat sink. The downward force on the heat sink is countered by an opposite upward force applied by a base section of the retainer on the substrate directly opposite the die attach area.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 1:
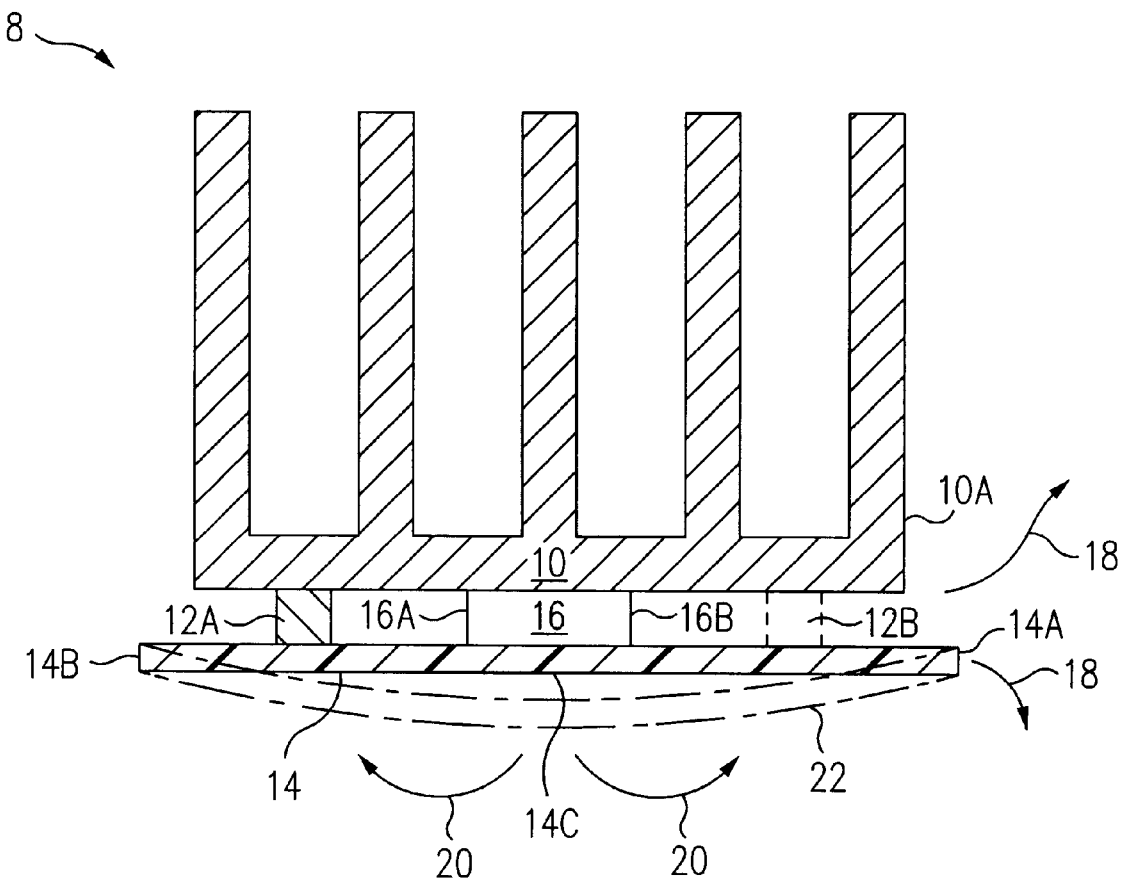
FIG. 1 is a side view of an electronic device which includes a heat sink directly attached by post type fastening members to a circuit board in accordance with the prior art.

In accordance with the present invention, a novel retainer 118 (FIG. 2) eliminates prior art problems associated with mounting a heat sink to an IC package.

As explained more completely below, an IC package 104 is attached to a die attach area 108 of a first (e.g. upper) surface of a substrate 102, typically a circuit board. Substrate 102 includes a plurality of apertures 122. A heat sink 112 is placed in thermal contact with IC package 104 so that each aperture 124 in heat sink 112 is substantially aligned with an aperture 122 in substrate 102, sometimes called a corresponding aperture 122 in substrate 102.

Retainer 118 includes fasteners 120, where each fastener 120 is connected to a different edge of a base section 126 of retainer 118 by a different spring element 130. Fasteners 120 are passed through corresponding apertures 122 in substrate 102 and through corresponding apertures 124 in heat sink 112. After passing through corresponding apertures 124 in heat sink 112, fasteners 120 engage and exert a first (e.g. downward) force on lips 140 of heat sink 112. Since each fastener 120 exerts an equal downward force on heat sink 112, heat sink 112 provides a uniform downward force distribution on IC package 104. Conversely, base section 126 supports the region of substrate 102 directly below IC package 104.

The uniform force distribution on IC package 104 maintains a uniform thermal contact with the top of IC package 104. The support of base section 126 prevents substrate 102 from bowing. Consequently, retainer 118 eliminates the prior art failure modes.

Figure 2:
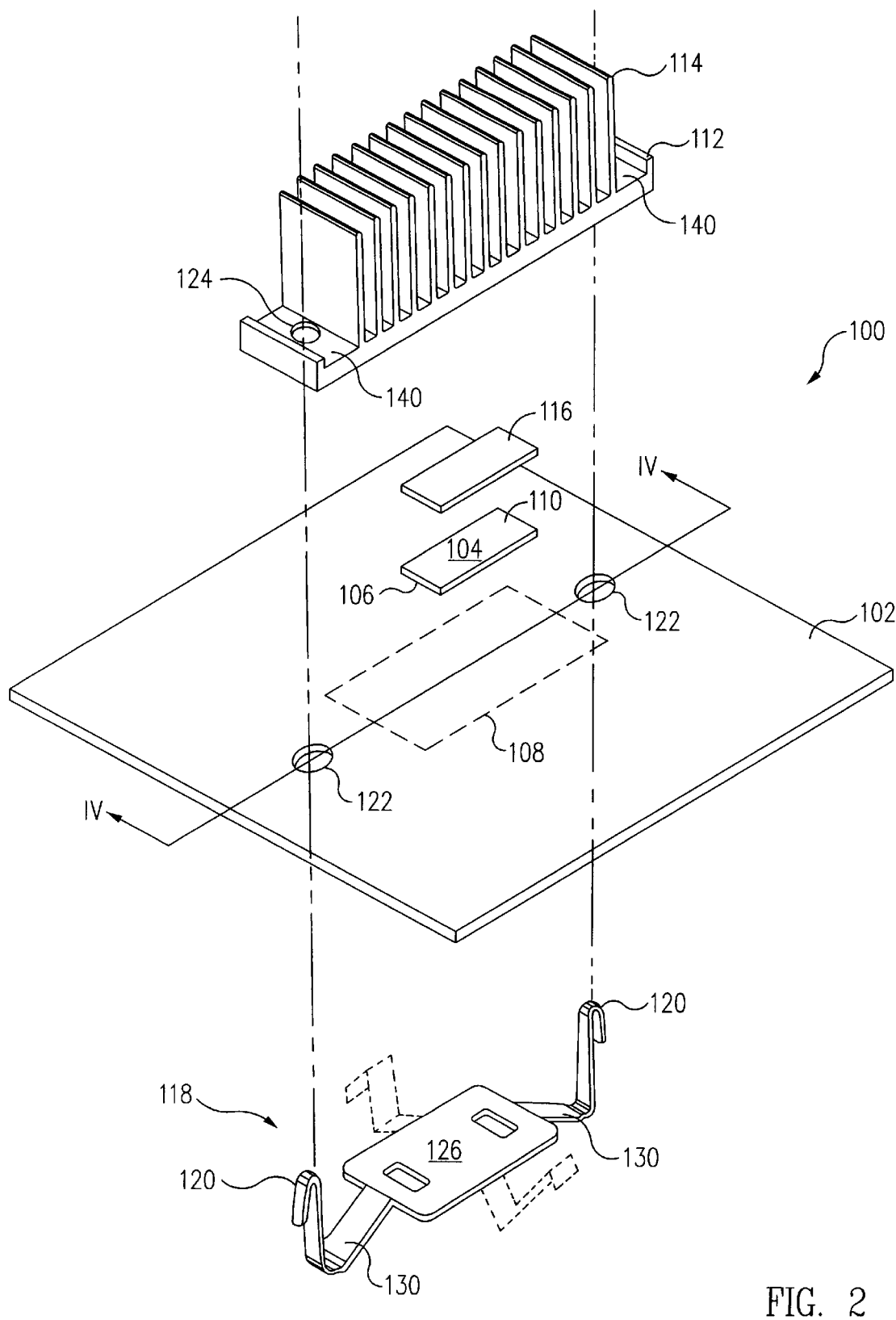
FIG. 2 is an exploded perspective view of an electronic device employing a heat sink assembly in accordance with the present invention.

In more detail, FIG. 2 is an exploded perspective view of an electronic device 100 employing a heat sink assembly in accordance with the present invention. Device 100 includes substrate 102 such as a printed circuit board (hereinafter referred to as circuit board 102). Attached to circuit board 102 is IC package 104 which includes a heat generating electronic component such as an integrated circuit. More particularly, a first (e.g. lower) surface 106 of IC package 104 is attached to a die attach area 108 of circuit board 102 typically by one or more circuit interconnections such as solder, solder balls, pins, or by adhesive. Although only a single IC package 104 is illustrated in FIG. 2 and the subsequent figures, more than one IC package, e.g., three, can be attached to die attach area 108 and used with a common heat sink assembly in accordance with the present invention.

In thermal contact with a heat transfer surface 110 of IC package 104 is a heat sink 112 having fins 114. Heat sink 112 is made of a material having a high thermal conductivity, e.g. is made of a metal such as aluminum or copper. Although fins 114 are illustrated in FIG. 2, other heat sink designs can also be used, e.g. solid heat sinks, plate type heat sinks and disk shaped heat sinks.

Typically, a thermal pad 116 such as an elastomer having a thermally conductive filler, e.g., aluminum oxide and/or boron nitride, is interposed between heat sink 112 and IC package 104 although other materials such as thermally conductive grease can be used. Examples of suitable materials for thermal pad 116 include THERM-A-GAP™ F574 manufactured by Chomerics, Inc. of Wolburn, Mass. and T-FORM™ 440 manufactured by Thermagon, Inc. of Cleveland, Ohio. Illustratively, thermal pad 116 is 1.016 millimeters thick and has adhesive on both sides. Thermal pad 116 is compliant thus compensating for any mismatch in physical characteristics and thermal expansion between heat sink 112 and IC package 104. Further, thermal pad 116 has a high thermal conductivity thus improving heat transfer between IC package 104 and heat sink 112 although, in an alternative embodiment, thermal pad 116 is not used and heat sink 112 directly contacts IC package 104.

Heat sink 112 is held in place and pressed into thermal contact with heat transfer surface 110 of IC package 104 by retainer 118. In this embodiment, retainer 118 is a spring like member having fasteners 120 in the shape of hooks for attaching retainer 118 to heat sink 112. Each fastener 120 passes through a different aperture 122 in circuit board 102 and through a different aperture 124 in heat sink 112 (only one aperture 124 is visible in FIG. 2). Hence, for each fastener 120, there is a corresponding aperture 122 in circuit board 102 and a corresponding aperture 124 in heat sink 112.

Figure 3:
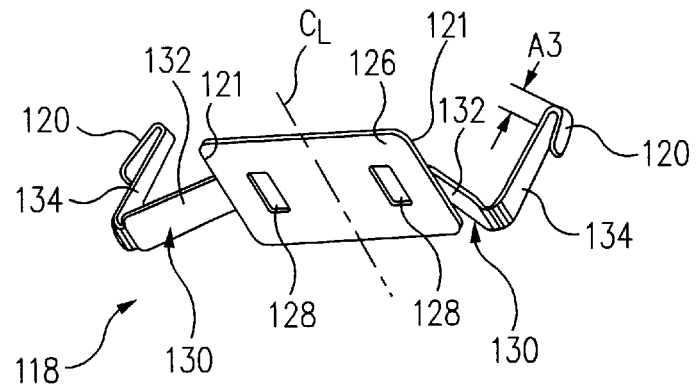
FIG. 3 is a bottom perspective view of a heat sink retainer in accordance with the present invention.

FIG. 3 is a bottom perspective view of retainer 118 in accordance with the present invention. As shown in FIG. 3, retainer 118 includes base section 126 having apertures 128. Apertures 128 can be used to allow electronic components such as capacitors (not shown) to extend down from circuit board 102 through apertures 128. Alternatively, base section 126 is formed without apertures 128.

A first fastener 120 is connected to a first edge 121 of base section 126 by a first spring element 130 and a second fastener 120 is connected to a second edge 121 of base section 126, opposite the first edge 121, by a second spring element 130. Referring to FIGS. 2 and 3 together, spring elements 130 pull fasteners 120 in a first direction (e.g. downwards) and against heat sink 112 and base section 126 supports circuit board 102 directly opposite IC package 104 in the final assembly. Although retainer 118 includes two fasteners 120 and corresponding spring elements 130, in light of this disclosure it is understood that a retainer having more than two fasteners, e.g. three or four as illustrated by the shadow lines in FIG. 2, can be used. Heat sink 112 and circuit board 102 would be modified accordingly.

Referring again to FIG. 3, each spring element 130 includes a spring arm 132 and a riser arm 134 integrally connected together. Each spring arm 132 is integrally connected to and extends from base section 126 and each riser arm 134 is integrally connected to a corresponding fastener 120. Generally, retainer 118 is symmetric around a centerline $C_L$. Retainer 118 is made of a flexible resilient material having a high spring rate. Thus, retainer 118 has the ability to return to its original form, i.e. relaxed state, after being forced out of shape. For example, retainer 118 is full hard type 302 stainless steel or, more generally, is steel although other materials such as beryllium copper can be used. Retainer 118 is typically integral, i.e. formed from a single piece, and is manufactured using well known techniques such as by stamping and bending a single piece of metal.

An illustrative specification for the various characteristics shown in FIG. 3 is set forth below in Table 1.

TABLE 1

| Characteristic | Specification | Units |
| --- | --- | --- |
| A3 | 0.15* | inches |

*Note: Begin taper.

Figure 4A:
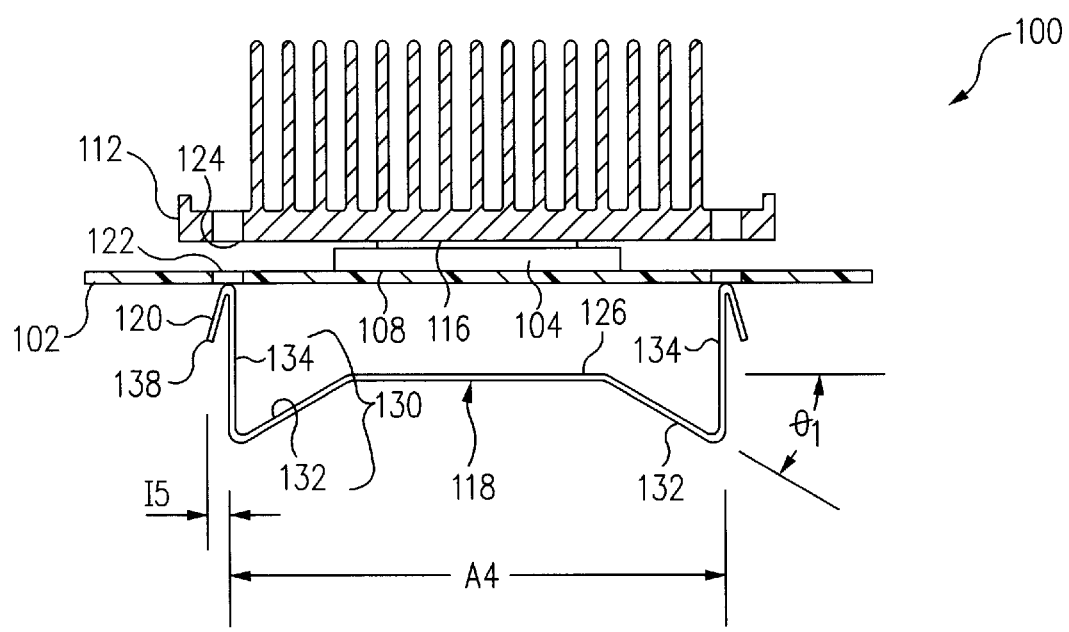
FIGS. 4A, 4B, 4C are cross-sectional views of the electronic device along the line IV—IV of FIG. 2.

FIG. 4A is a cross-sectional view of device 100 along the line IV—IV of FIG. 2. Referring now to FIG. 4A, to clip heat sink 112 into place, heat sink 112 is positioned above circuit board 102 such that IC package 104 is located between heat sink 112 and circuit board 102. Apertures 124 in heat sink 112 are substantially aligned with corresponding apertures 122 in circuit board 102. Retainer 118 is then positioned in its relaxed state such that fasteners 120 are aligned directly below corresponding apertures 122 in circuit board 102 as shown in FIG. 4A.

When retainer 118 is in its relaxed state, a first angle $\theta_1$ is formed by an intersection between a plane defined by an exterior surface of base section 126 and a plane defined by an exterior surface of spring arm 132. Illustratively, angle $\theta_1$ is approximately 25 degrees. Further, the distance I5 between a tip 138 of fastener 120 and the respective riser arm 134 is greater than the diameter of the corresponding aperture 124 in heat sink 112. As an illustration, each of apertures 124 in heat sink 112 has a diameter of approximately 0.16 inches. Typically, the diameters of apertures 122 in circuit board 102 are at least as great as the diameters of apertures 124 in heat sink 112.

Figure 4B:
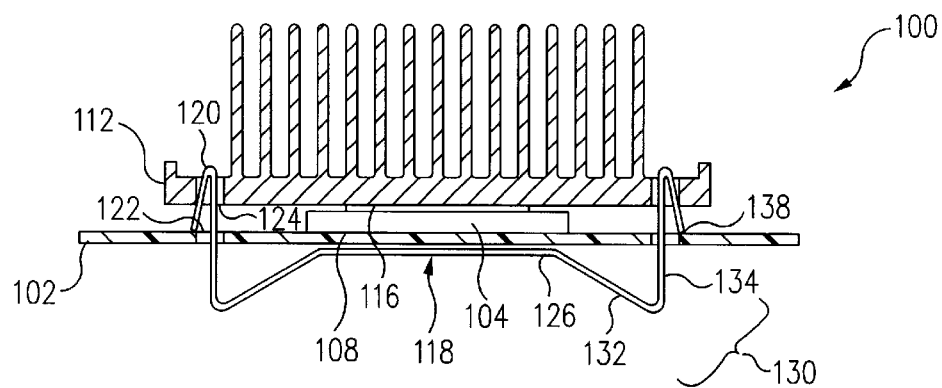

To secure heat sink 112 with retainer 118, retainer 118 is pressed towards circuit board 102. More particularly, refer-ring now to FIG. 4B, fasteners 120 are pressed through corresponding apertures 122 in circuit board 102. In the event that the diameters of apertures 122 is less than distance I5, fasteners 120 are compressed towards the respective riser arms 134 allowing fasteners 120 to pass through corresponding apertures 122.

While holding heat sink 112 in place, fasteners 120 are pressed through corresponding apertures 124 in heat sink 112. Since the diameters of apertures 124 are less than distance I5, fasteners 120 are compressed towards the respective riser arms 134 such that the distance between tips 138 and the respective riser arms 134 becomes less than distance I5.

Retainer 118 is pressed and continues to move towards circuit board 102 until base section 126 contacts, and is prevented from moving further by, circuit board 102. Spring elements 130, e.g. spring arms 132 and/or riser arms 134, are pressed towards circuit board 102 to completely pass fasteners 120 through corresponding apertures 124.

Figure 4C:
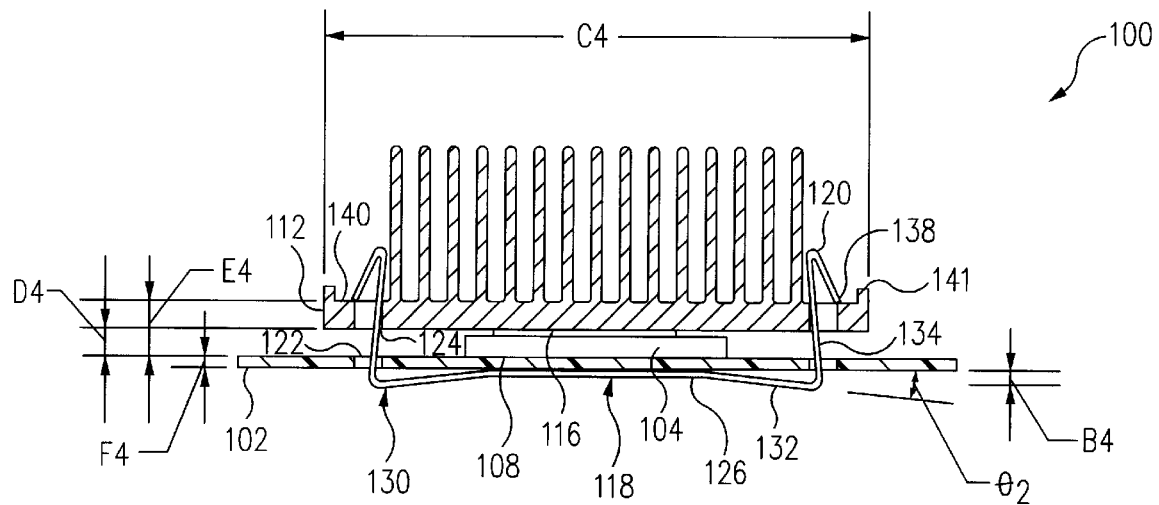

Referring now to FIG. 4C, upon passing through corresponding apertures 124, fasteners 120 attach to heat sink 112. More particularly, upon passing through corresponding apertures 124, fasteners 120 return to their relaxed state and extend beyond corresponding apertures 124 and press against corresponding lips 140 of heat sink 112. An outer ridge 141 extends from each lip 140 to insure that fasteners 120 do not slip from lips 140. Although retainer 118 includes fasteners 120, in light of this disclosure it is understood that other fasteners, e.g. screws, can be use to secure retainer 118 to heat sink 112.

Of importance, spring elements 130 are under tension when heat sink 112 is secured by retainer 118. In particular, referring to FIGS. 4A and 4C together, the angle formed by an intersection between a plane defined by an exterior surface of base section 126 and a plane defined by an exterior surface of spring arm 132 is angle $\theta_2$, where angle $\theta_2$ is less than angle $\theta_1$ between these elements when retainer 118 is in its relaxed state. For example, angle $\theta_2$ is approximately 8 degrees.

As a result of retainer 118 being bent out of shape, riser arms 134 are pulled in a first direction, e.g. downward in the vertical direction. Accordingly, fasteners 120 impart a first (e.g. vertical downward) force on lips 140 of heat sink 112. Hence, heat sink 112 presses down towards IC package 104. More particularly, heat sink 112 presses down on thermal pad 116 which presses down on IC package 104 thus creating the thermal contact between IC package 104 and heat sink 112.

Of importance, heat sink 112 presses down uniformly on IC package 104. This is because spring elements 130 of retainer 118 are symmetrically displaced and impart an equal downward force on both sides of heat sink 112. Thus, a heat sink assembly in accordance with the present invention avoids the application of uneven force distribution on the IC package and the associated damage and ultimate device failure caused by use of conventional heat sink assemblies.

The vertical downward force applied on heat sink 112 by fasteners 120 is countered by an equal second (e.g. vertical upward) force applied by base section 126 of retainer 118 on circuit board 102 directly opposite IC package 104. As shown in FIG. 4C, base section 126 is located on the lower surface of circuit board 102 directly opposite die attach area 108. Thus, the upward force is transferred from base section 126 directly back to heat sink 112 through circuit board 102, IC package 104 and thermal pad 116 without imparting any bending force on circuit board 102. In this manner, a heat sink assembly in accordance with the present invention avoids circuit board warpage and the ultimate device failure associated with conventional heat sink assemblies.

Further, by sizing base section 126 to be essentially the shape of IC package 104 and locating base section 126 directly opposite IC package 104, equal force distribution from base section 126 to IC package 104 is assured. Although base section 126 is illustrated in FIG. 4C as directly contacting circuit board 102, it is understood that generally base section 126 is located adjacent circuit board 102 directly opposite die attach area 108 and that a structure such as a protective pad can be interposed between base section 126 and circuit board 102.

Heat sink 112 is also readily removed. To remove heat sink 112, referring to FIG. 4C, fasteners 120 are compressed towards respective riser arms 134 such that the distance between tips 138 and respective riser arms 134 becomes less than the diameters of apertures 124. Once compressed, fasteners 120 easily slip down and through apertures 124 allowing heat sink 112 to be removed.

Illustrative specifications for the various characteristics shown in FIGS. 4A, 4C are set forth below in Table 2.

TABLE 2

| Characteristic | Specification | Units |
| --- | --- | --- |
| A4 | 2.525 | inches |
| B4 | 0.080 | inches |
| C4 | 3.026 | inches |
| D4 | 0.150 | inches |
| E4 | 0.270 | inches |
| F4 | 0.062 | inches |
| I5 | 0.17 | inches |

Figure 5:
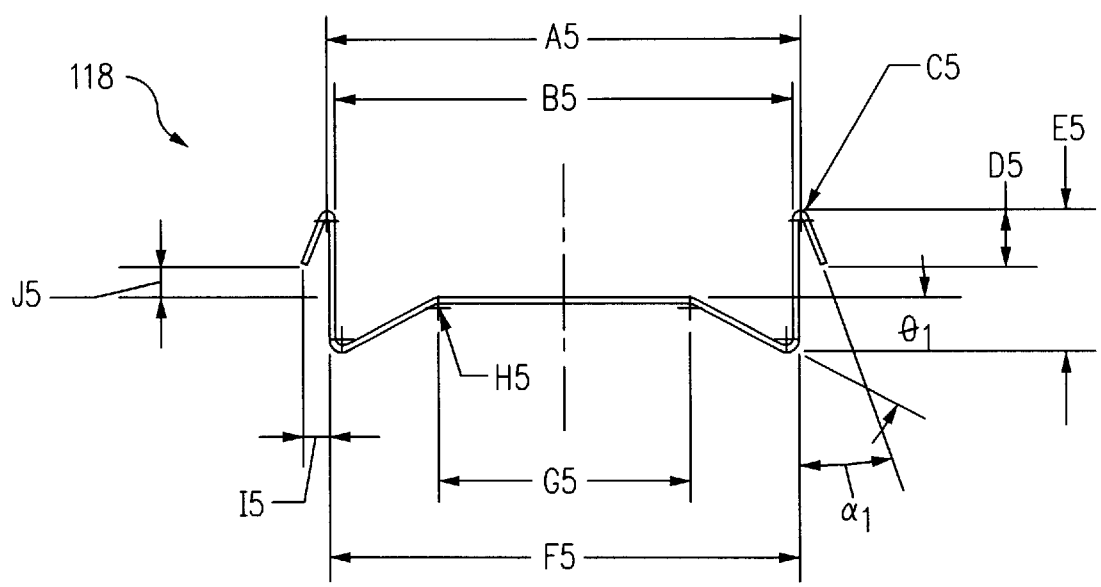
FIG. 5 is a front view of the heat sink retainer of FIG. 3.

FIG. 5 is a front view of retainer 118 in the relaxed state as defined above. Illustrative specifications for the various characteristics shown in FIG. 5 are set forth below in Table 3.

TABLE 3

| Characteristic | Specification | Unit |
| --- | --- | --- |
| A5 | 2.525 | inches |
| B5 | 2.415 | inches |
| C5 | 2xR0.030 | inches |
| D5 | 0.344 | inches |
| E5 | 0.770 | inches |
| F5 | 2.465 | inches |
| G5 | 1.355 | inches |
| H5 | 4xR0.050 | inches |
| I5 | 0.17 | inches |
| J5 | 2x0.140 | inches |
| $\theta_1$ | 24.785 | degrees |
| $\alpha_1$ | 16.252 | degrees |

Figure 6:
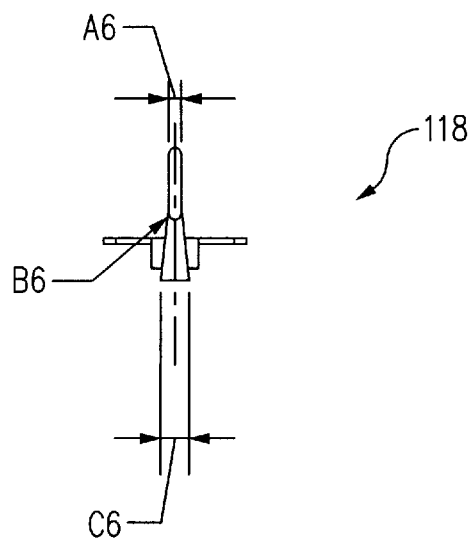
FIG. 6 is a side view of the heat sink retainer of FIG. 3.

FIG. 6 is a side view of retainer 118 in the relaxed state as defined above. Illustrative specifications for the various characteristics shown in FIG. 6 are set forth below in Table 4.

TABLE 4

| Characteristic | Specification | Units |
| --- | --- | --- |
| A6 | 0.060 | inches |
| B6 | 4xR.03 | inches |
| C6 | 0.145 | inches |

Figure 7:
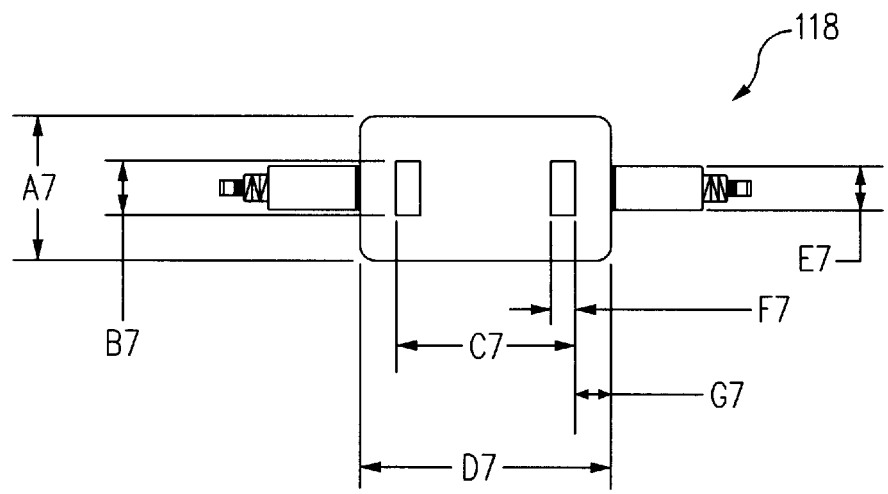
FIG. 7 is a bottom view of the heat sink retainer of FIG. 3.

FIG. 7 is a bottom view of retainer 118 in the relaxed state as defined above. Illustrative specifications for the various characteristics shown in FIG. 7 are set forth below in Table 5.

TABLE 5

| Characteristic | Specification | Units |
| --- | --- | --- |
| A7 | 0.787 | inches |
| B7 | 0.305 | inches |
| C7 | 0.937 | inches |
| D7 | 1.355 | inches |
| E7 | 0.236 | inches |
| F7 | 2x0.138 | inches |
| G7 | 0.209 | inches |

Figure 8:
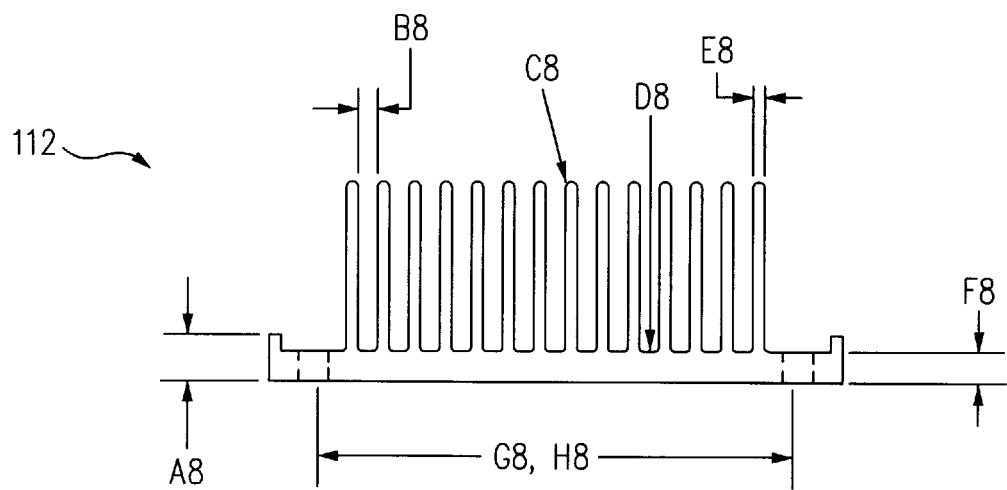
FIG. 8 is a front view of a heat sink in accordance with the present invention.

FIG. 8 is a front view of heat sink 112 in accordance with the present invention. Illustrative specifications for the various characteristics shown in FIG. 8 are set forth below in Table 6.

TABLE 6

| Characteristic | Specification | Units |
| --- | --- | --- |
| A8 | 5.94 | millimeters |
| B8 | 3.08 13X | millimeters |
| C8 | full R 13X | millimeters |
| D8 | full R 13X | millimeters |
| E8 | 1.00 14X | millimeters |
| F8 | 3.94 | millimeters |
| G8 | 63.94 | millimeters |
| H8 | Surface flatness to 0.10 | millimeters |

Figure 9:
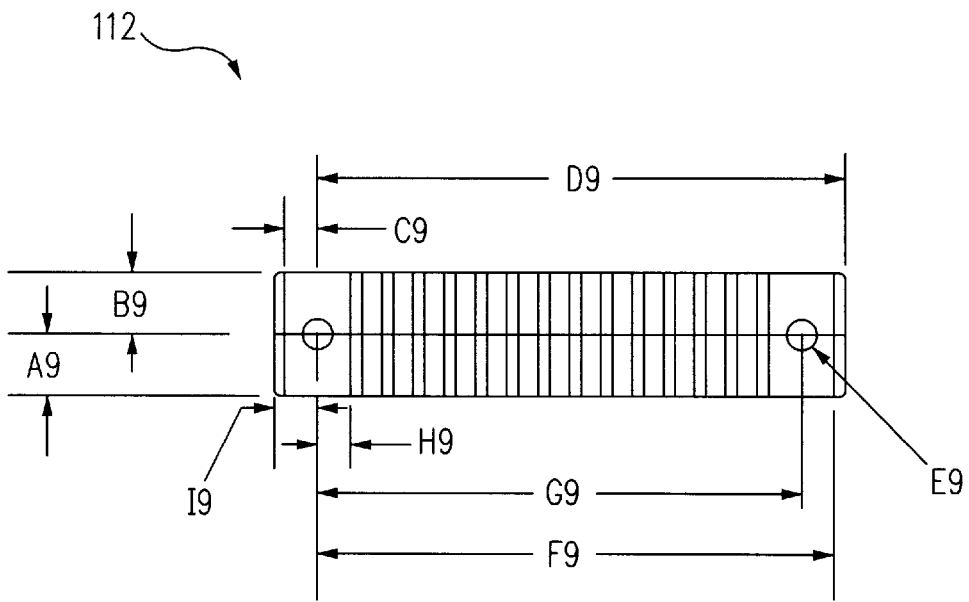
FIG. 9 is a top view of the heat sink of FIG. 8.

FIG. 9 is a top view of heat sink 112 of FIG. 8. Illustrative specifications for the various characteristics shown in FIG. 9 are set forth below in Table 7.

TABLE 7

| Characteristic | Specification | Units |
| --- | --- | --- |
| A9 | 8.50 | millimeters |
| B9 | 8.50 | millimeters |
| C9 | 3.86 | millimeters |
| D9 | 70.49 | millimeters |
| E9 | 4.08 2X | millimeters |
| F9 | 67.96 | millimeters |
| G9 | 64.13 | millimeters |
| H9 | 5.04 | millimeters |
| I9 | 6.36 | millimeters |

Figure 10:
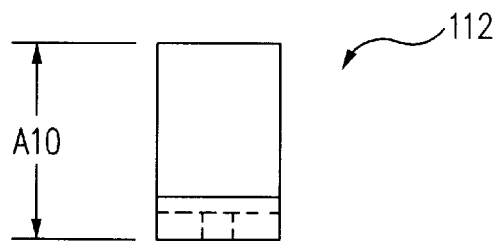
FIG. 10 is a side view of the heat sink of FIG. 8.

FIG. 10 is a side view of heat sink 112 of FIG. 8. An illustrative specification for the various characteristics shown in FIG. 10 is set forth below in Table 8.

TABLE 8

| Characteristic | Specification | Units |
| --- | --- | --- |
| A10 | 27.10 | millimeters |

The drawings and the forgoing description gave examples of the present invention. The scope of the present invention, however, is by no means limited by these specific examples. Numerous variations, whether explicitly given in the specification, such as differences in structure, dimension, and use of material, are possible. The scope of the invention is at least as broad as given by the following claims.

We claim:

1. A structure comprising:
   a heat sink comprising a first aperture and a second aperture;

a circuit board;

a package comprising an electronic component, wherein said package is located between said heat sink and said circuit board and attached to a die attach area of said circuit board; and a retainer comprising:

a base section located adjacent said circuit board directly opposite said die attach area, said base section supporting said circuit board;

a first hook-shaped fastener;

a first spring element connecting said first hook-shaped fastener to a first edge of said base section, said first spring element comprising a first riser arm, a diameter of said first aperture of said heat sink being less than a distance between a tip of said first hook-shaped fastener and said first riser arm;

a second hook-shaped fastener; and a second spring element connecting said second hook-shaped fastener to a second edge of said base section, said second spring element comprising a second riser arm, a diameter of said second aperture of said heat sink being less than a distance between a tip of said second hook-shaped fastener and said second riser arm.

2. The structure of claim 1 wherein said retainer passes through apertures in said circuit board and attaches to said heat sink, said retainer pressing said heat sink towards said package without imparting a bending force on said circuit board.

3. The structure of claim 1 wherein said first hook-shaped fastener presses on a first lip of said heat sink and wherein said second hook-shaped fastener presses on a second lip of said heat sink, said heat sink further comprising:

a first ridge extending from said first lip to prevent said first hook-shaped fastener from slipping from said first lip; and a second ridge extending from said second lip to prevent said second hook-shaped fastener from slipping from said second lip.

4. The structure of claim 1 wherein said base section comprises at least one aperture.

5. A structure comprising:

a retainer comprising:

a plurality of hook-shaped fasteners;

a base section having a plurality of edges; and a plurality of spring elements, wherein each spring element of said plurality of spring elements comprises a riser arm and connects a different hook-shaped fastener of said plurality of hook-shaped fasteners to a different edge of said plurality of edges; and a heat sink having a plurality of apertures corresponding to said plurality of hook-shaped fasteners, wherein a diameter of each aperture of said plurality of apertures is less than a distance between each tip of said plurality of hook-shaped fasteners and a respective one of said riser arms.

6. The structure of claim 5 further comprising a substrate having a plurality of apertures corresponding to said plurality of hook-shaped fasteners, each of said riser arms passing through a corresponding aperture of said plurality of apertures in said substrate.

7. The structure of claim 6 further comprising a package comprising an electronic component, said package located between said heat sink and said substrate.

8. The structure of claim 7 wherein said package is attached to a die attach area of said substrate, said base section being located adjacent said substrate directly opposite said die attach area.

9. The structure of claim 5 wherein each spring element of said plurality of spring elements comprises a spring arm attached to said base section.

10. The structure of claim 5 wherein a number of said plurality of hook-shaped fasteners is greater than two.

11. The structure of claim 5 wherein said retainer is symmetric around a center line of said retainer.

12. The structure of claim 5 wherein said retainer has the ability to return to its original form after being bent out of shape.

13. A method of pressing a heat sink into thermal contact with a package comprising an electronic component, said method comprising:

attaching said package to a die attach area of a substrate;

positioning said heat sink such that said package is located between said heat sink and said substrate; and attaching fasteners of a retainer to said heat sink by passing said fasteners through apertures in said heat sink, wherein said fasteners are compressed while passing through said apertures, wherein said fasteners impart a first force on said heat sink, said first force being countered by an opposite second force applied by a base section of said retainer on said substrate directly opposite said die attach area.

14. The method of claim 13 wherein said first force and said second force are applied without imparting a bending force to said substrate.

15. The method of claim 13 wherein said fasteners return to their relaxed state after passing through said apertures.

16. The method of claim 13 wherein said fasteners are attached to said base section by spring elements, said attaching comprising placing said spring elements under tension.

17. The method of claim 13 wherein said fasteners press against lips of said heat sink, said method further comprising preventing said fasteners from slipping from said lips.

18. The method of claim 17 wherein ridges extending from said lips prevent said fasteners from slipping from said lips.

* * * * *